United States Patent
Vollertsen

(10) Patent No.: US 8,215,830 B2
(45) Date of Patent: Jul. 10, 2012

(54) APPARATUS AND METHOD FOR MEASURING LOCAL SURFACE TEMPERATURE OF SEMICONDUCTOR DEVICE

(75) Inventor: Rolf-Peter Vollertsen, Grasbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/868,731

(22) Filed: Aug. 26, 2010

(65) Prior Publication Data
US 2010/0322285 A1    Dec. 23, 2010

Related U.S. Application Data

(63) Continuation of application No. 11/746,332, filed on May 9, 2007, now Pat. No. 7,798,703.

(51) Int. Cl.
*G01K 15/00* (2006.01)
*G01N 25/00* (2006.01)
*G01N 27/00* (2006.01)
*H01L 23/58* (2006.01)

(52) U.S. Cl. ............ 374/100; 374/178; 374/1; 702/130; 702/99; 327/513; 257/48

(58) Field of Classification Search ............ 374/1, 178, 374/170, 171, 172, 173, 57, 4, 100, 5; 702/99, 702/130, 131, 132, 133, 134, 136; 327/411, 327/427, 432, 478, 564, 566, 512, 513; 257/565, 257/43, 48, E23.001, 213; 438/4, 54, 57, 438/63
See application file for complete search history.

(56) References Cited

U.S. PATENT DOCUMENTS

| | | | | |
|---|---|---|---|---|
| 3,582,690 A * | 6/1971 | Yerman | ......................... | 327/516 |
| 5,202,590 A * | 4/1993 | Liepold et al. | .................. | 327/77 |
| 5,371,477 A * | 12/1994 | Ikeda et al. | .................... | 330/282 |
| 5,796,290 A * | 8/1998 | Takahashi | ..................... | 327/512 |
| 6,091,286 A * | 7/2000 | Blauschild | .................... | 327/543 |
| 7,623,373 B2 * | 11/2009 | Barkley | .................... | 365/185.03 |
| 2001/0003507 A1 * | 6/2001 | Maruyama et al. | ........ | 365/185.2 |
| 2008/0272828 A1 * | 11/2008 | Min | .............................. | 327/512 |

\* cited by examiner

*Primary Examiner* — Gail Verbitsky

(74) *Attorney, Agent, or Firm* — SpryIP, LLC

(57) ABSTRACT

An apparatus and method is described for measuring a local surface temperature of a semiconductor device under stress. The apparatus includes a substrate, and a reference MOSFET. The reference MOSFET may be disposed closely adjacent to the semiconductor device under stress. A local surface temperature of the semiconductor device under stress may be measured using the reference MOSFET, which is not under stress. The local surface temperature of the semiconductor device under stress may be determined as a function of drain current values of the reference MOSFET measured before applying stress to the semiconductor device and while the semiconductor device is under stress.

7 Claims, 7 Drawing Sheets

APPARATUS AND METHOD FOR MEASURING LOCAL SURFACE TEMPERATURE OF SEMICONDUCTOR DEVICE

RELATED APPLICATIONS

This application is a Continuation Application of co-pending patent application Ser. No. 11/746,332, which was filed on May 9, 2007. The priority of the co-pending patent application is hereby claimed. The entire contents of the co-pending patent application are incorporated herein by reference.

BACKGROUND

In many situations, it is desirable to accurately measure a local temperature of a working device under stress. The device under stress may not be used typically because it's drain current degrades due to the stress.

Some prior methods of accurately measuring a local temperature of a device under stress involved the use of a metal line formed at a higher level than a gate of the semiconductor device under stress of elevated temperatures or current and resulted in inaccurate measurements due to different temperatures at the different levels. Thickness variation of the layers between the device under stress and a temperature sensor may also make calibration difficult. Calibration would need adjustments for manufactured devices, which is not practical. Diodes and transistors have also been used, but need sophisticated algorithms and well optimized corrections for temperature calculation. Junctions of such diodes and transistors are in a certain depth of the semiconductor material where the temperature could be lower due to a steep temperature gradient. Such junctions are not at an interface of interest, and are likely at a different temperature due to temperature gradients. Some methods sense temperature closer to the interface of interest, but use multiple pads for MOS gates. Such gates may act as an antenna and collect charge during processing, possibly damaging the device and making it non-representative of the process.

While performing a fast wafer level reliability (fWLR) test, i.e., applying stress to a semiconductor device, it is desirable to find an accurate and less expensive way to measure a local temperature proximate the interface between a substrate and a working area or channel of the semiconductor device under stress.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

The following detailed description refers to the accompanying drawings that show, by way of illustration, specific details and embodiments in which the application may be practiced. These embodiments are described in sufficient detail to enable those skilled in the art to practice the application. Other embodiments may be utilized and structural, logical, and electrical changes may be made without departing from the scope of the application. The various embodiments are not necessarily mutually exclusive, as some embodiments can be combined with one or more other embodiments to form new embodiments.

The terms "a" or "an" in the following description may be used, as is common in patent documents, to include one or more than one. The term "or" the following description may be used to refer to nonexclusive or, such that "A or B" includes "A but not B," "B but not A," and "A and B," unless otherwise indicated.

The terms "wafer" and "substrate" in the following description may be used interchangeably to refer generally to any structure on which integrated circuits are formed and also to such structures during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "fWLR" in the following description denotes "fast wafer level reliability (fWLR)". The term "MOSFET" in the following description denotes "Metal Oxide Semiconductor Field Effect Transistor". In contrast to FWLR, WLR tests may be longer in duration and may use heated chucks in place of local heaters in test structures.

Figure 1:
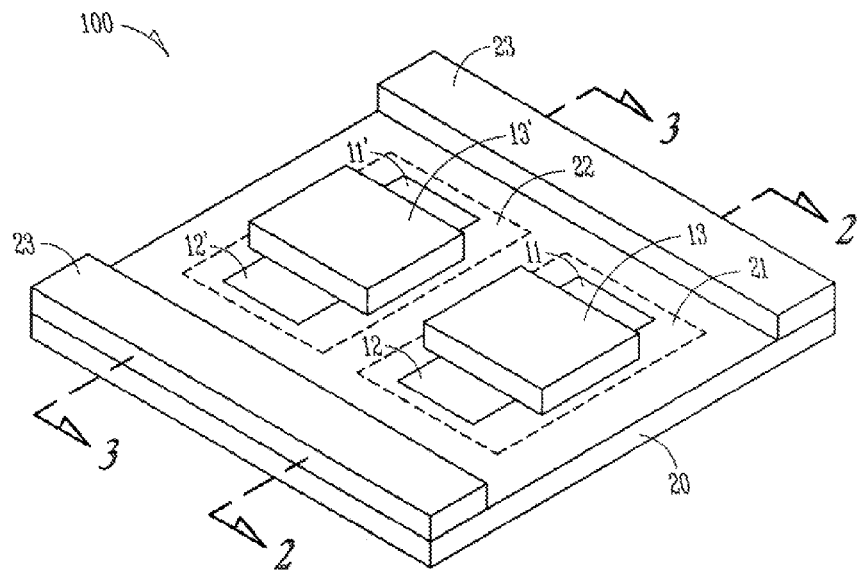
FIG. 1 is a perspective view of an apparatus for measuring temperature of a semiconductor device under stress, in accordance with an example embodiment of the application.

FIG. 1 is a perspective view of an apparatus 100 for measuring temperature of a semiconductor device 22 under stress in accordance with an example embodiment of the application. The term "under stress" or "stressed" generally refers to different critical device stresses. The kind that is worse at higher temperature is called NBTI (negative bias temperature instability). This stress generally results from increased temperature and elevated gate bias. For an unstressed device, the gate bias may be kept within regular operation conditions.

In one embodiment, the apparatus 100 for measuring temperature includes: a substrate 20, and a reference MOSFET 21. The reference MOSFET 21 is supported by the substrate 20, such as having one or more portions disposed above, on, or in the substrate 20 and closely adjacent to a semiconductor device 22 to be tested under stress while the reference MOSFET 21 is not under stress. In one embodiment, closely adjacent is generally achieved when the reference MOSFET 21 is disposed adjacent enough to the semiconductor device 22 such that the local surface temperature of the reference MOSFET 21 is substantially the same as the local surface temperature of the semiconductor device 22 under stress. Effects of temperature gradients across the substrate 20 are minimized with smaller distances. Potentially less than optimal temperature equalization may be achieved, but would still be within an acceptable tolerance range, if the reference MOSFET 21 is deposed adjacent or in the vicinity of the semiconductor device 22 under stress.

The local surface temperature of the semiconductor device 22 under stress can be measured using the unstressed reference MOSFET 21. In one embodiment, the stress is thermal stress. In another embodiment, the stress is electrical stress, which may be further accelerated by temperature to avoid occurrence of high bias induced degradation.

Figure 9:
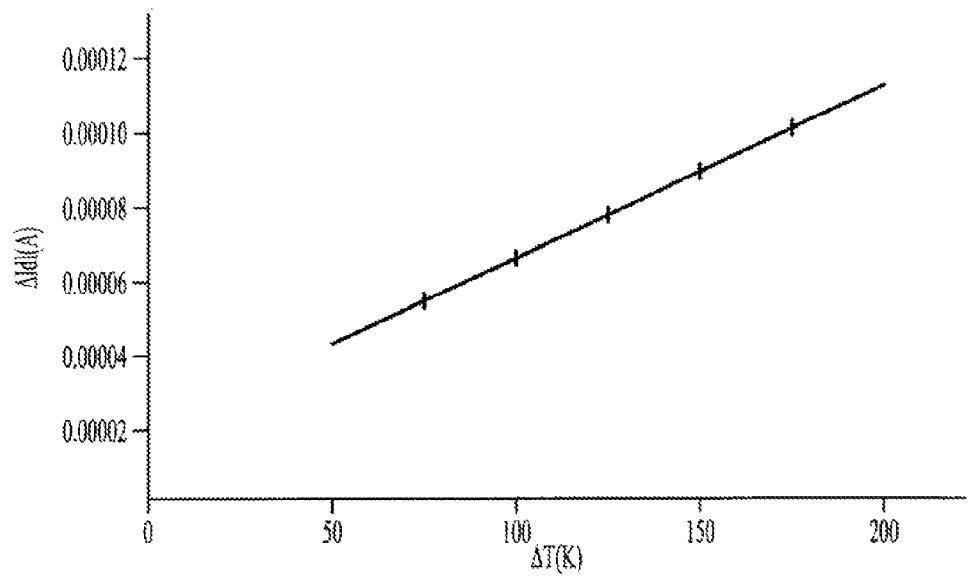
FIG. 9 is a graph illustrating linear relation between the linear drain current (Id1) and the temperature of a reference MOSFET.

In some embodiments, the local surface temperature of the semiconductor device 22 under stress is determined as a function of a drain current value $I_1$ and $I_2$ of the reference MOSFET 21 respectively measured before applying stress to the semiconductor device 22 and while the semiconductor device 22 is under stress. An example for the linear relation between the linear drain current (Id1) and the temperature is shown in FIG. 9 and can be utilized for calculating the local surface temperature of the reference MOSFET 21. In some embodiments, the relation between the drain current and temperature may be in accordance with a function other than linear so that it would then be necessary to detect the deviation from a linear relation. Such a deviation may be detected during the calibration procedure for new technologies or devices, by measuring the drain current of the sense device at different chuck temperatures, which ensures a uniform known temperature throughout the wafer.

In some embodiments, the apparatus 100 includes at least one heater 23 (e.g., two heaters 23 are shown in FIG. 1) disposed above the substrate 20 and adjacent to the semiconductor device 22. The heater 23 can be used to enhance the temperature of the semiconductor device 22 under test which increases the stress. In one embodiment, the heaters 23 consist of heating stripes along both sides of the device, and are longer than the device in order to create a temperature with a negligible gradient. A temperature plateau may be formed in the device area with lateral gradients outside of the devices. The reference device 21 in one embodiment, is thermally at the same condition as the device 22 to be stressed. Multiple heater stripes, such as a substantially parallel stripes may also be used in further embodiments. In one embodiment, the heater 23 is made of polysilicon. Heater 23 may also be formed of high resistive metal, or various diffusions, or any other type of structure that may be used to produce heat.

In some embodiments, the width of the reference MOSFET 21 is smaller than the width of the semiconductor device 22 so be subjected to stress. In one embodiment, devices used in reliability investigations are fresh and unstressed, as opposed to the devices to be stressed. In a further embodiment, reference MOSFET 21 may be prestressed, but such pre-stressing does not adversely affect drain current temperature dependence in one embodiment. The reference MOSFET 21 remains unstressed during stress testing in one embodiment, which is usually accomplished by not increasing the bias voltage above use voltage. If the reference MOSFET 21 were to be stressed during stress testing, like the device 22, the current through reference MOSFET 21 may change due to such stress and this change is similar to the temperature effect on the current. Thus a wrong temperature may be determined after some stress time. The measured temperature may be used to control the heater. A wrong measurement leads to temperature changes and the entire apparatus drifts uncontrolled either self enhancing or inhibiting the stress.

In some embodiments, the gate bias voltage of the reference MOSFET 21 is kept low during temperature sensing to keep it from being in a stressed condition. In further embodiments, devices 21 and 22 could represent different oxide thickness or device dimensions and one may be used for sensing while the other is stressed and subsequently vice versa. Again, the device being used for sensing may be previously stressed, but should remain unstressed during such testing, such as by keeping the bias current low.

Figure 2:
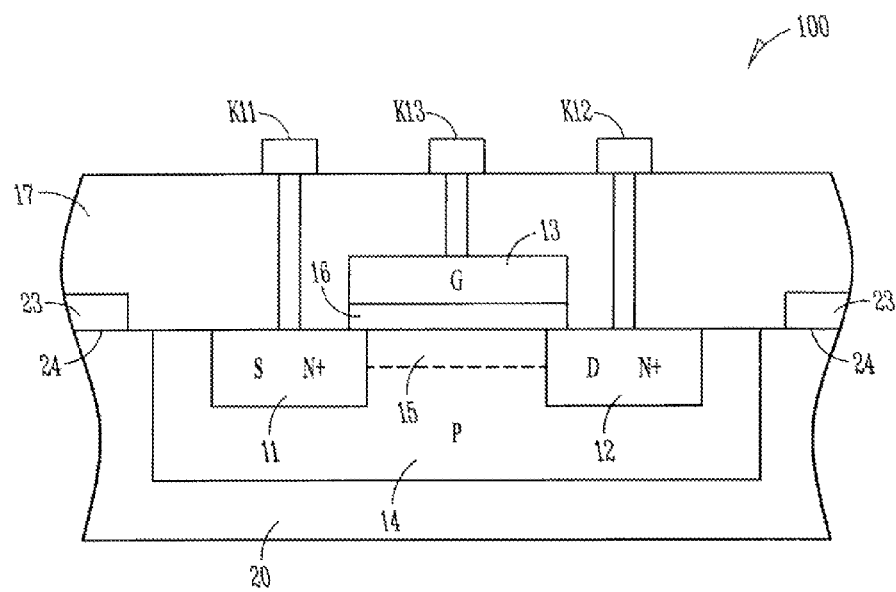
FIG. 2 is a cross-sectional view of the apparatus for measuring the temperature of the semiconductor device under stress shown in FIG. 1 through lines 2'-2', in accordance with an example embodiment of the application.

FIG. 2 is a cross-sectional view of the apparatus 100 for measuring temperature of the semiconductor device 22 under stress shown in FIG. 1 through lines 2'-2', in accordance with an example embodiment of the application.

In the embodiment as shown in FIG. 2, the reference MOSFET 21 is a planar MOSFET that includes a source 11, a drain 12, and a gate 13. The source 11 and drain 12 are two highly doped regions of the same type (e.g., N type, marked as N+) formed in and separated by a body 14. The body 14 is a doped region of opposite type (e.g., P type) formed in the substrate 20. The substrate 20 may be made of a semiconductor material, for example, selected from a group consisting of silicon, germanium, and a mixture of silicon and germanium (SiGe). A channel 15 can be formed between the source 11 and the drain 12 of the reference MOSFET 21. A thin insulating layer 16 is deposited above the channel 15. The thin insulating layer 16 is very thin, for example, 2 μm. Other thicknesses may also be used, such as 10 nm for example. A thinner layer generally is more sensitive to thermally enhanced electrical stress. The thin insulating layer 16 may be made of silicon dioxide ($SiO_2$) or other suitable insulating material. The gate 13 is formed above the thin insulating layer 16. An insulating layer 17 is formed to fill the space between the substrate 20, the source 11, the drain 12, the gate 13, and the heaters 23. In one embodiment, polysilicon used for the heaters 23 may be at approximately the same level as that used for the gate. Heaters 23 are generally isolated from the substrate, such as by an oxide layer or other insulating material 24. The insulating layer 17 may be made of borophosphosilicate glass (BPSG) or other suitable insulating material. In some embodiments, a source contact K11, a drain contact K12, and a gate contact K13 are respectively formed through the insulating layer 17 to electrically couple the source 11, drain 12 and gate 13 of the reference MOSFET 21 to external circuits.

In some other embodiments, the reference MOSFET 21 is a vertical MOSFET or a FinFET or some other non-planar structure.

Figure 3:
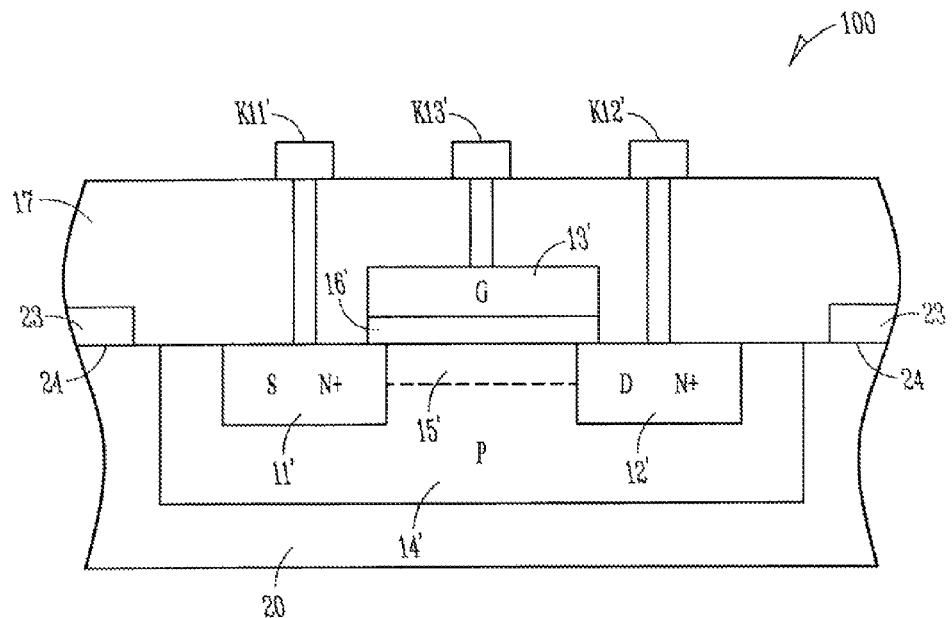
FIG. 3 is a cross-sectional view of the apparatus for measuring the temperature of the semiconductor device under stress shown in FIG. 1 through lines 3'-3', in accordance with an example embodiment of the application.

FIG. 3 is a cross-sectional view of the apparatus 100 for measuring temperature of the semiconductor device 22 under stress shown in FIG. 1 through lines 3'-3', in accordance with an example embodiment of the application.

In the embodiment as shown in FIG. 3, the semiconductor device 22 to be subjected to stress is a MOSFET, which may have a similar structure with that of the reference MOSFET 21. The semiconductor device 22 includes a source 11', a drain 12', and a gate 13' formed in and separated by a body 14'. The body 14' is a doped region of opposite type (e.g., P type) formed in the substrate 20. A channel 15' can be formed between the source 11' and the drain 12' of the semiconductor device 22. A thin insulating layer 16' is deposited above the channel 15'. The thin insulating layer 16' may be made of silicon dioxide ($SiO_2$) or other suitable insulating material. The gate 13' is formed above the thin insulating layer 16'. An insulating layer 17 is formed to fill the space between the substrate 20, the source 11', the drain 12', the gate 13', and the heaters 23. The insulating layer 17 may be made of borophosphosilicate glass (BPSG) or other suitable insulating material. In some embodiments, a source contact K11', a drain contact K12', and a gate contact K13' are respectively formed through the insulating layer 17 to electrically couple the source 11', drain 12' and gate 13' of the semiconductor device 22 to external circuits.

In some embodiments, referring again to FIG. 1, because the reference MOSFET 21 is disposed adjacent enough to the semiconductor device 22, the local surface temperature at the interface between the thin insulating layer 16 and the channel 15 of the unstressed reference MOSFET 21 is substantially the same as the local surface temperature at the interface between the thin insulating layer 16' and the channel 15' of the semiconductor device 22 under stress. Thus, the local surface temperature at the interface between the thin insulating layer 16' and the channel 15' of the semiconductor device 22 under stress can be measured using the unstressed reference MOSFET 21.

Although the semiconductor device 22 to be subjected to stress is shown as a MOSFET in FIG. 1 and FIG. 3, the semiconductor device 22 to be subjected to stress is not limited to a MOSFET, but may also be another type of semiconductor device. For example, the semiconductor device 22 to be subjected to stress may be a diode, a bipolar transistor, a Darlington transistor, or a FINFET (fin field effect transistor). In bipolar device embodiments, a junction would be used for the measurement of temperature.

Figure 4:
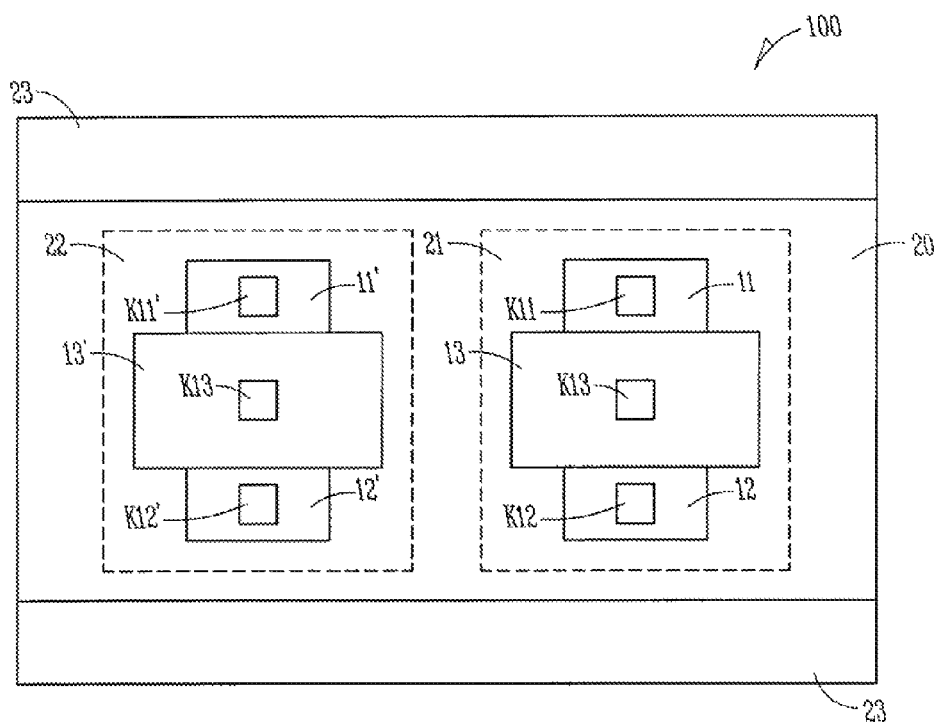
FIG. 4 is a planar top view of the apparatus for measuring the temperature of the semiconductor device under stress, in accordance with an example embodiment of the application.

FIG. 4 is a planar top view of the apparatus 100 for measuring temperature of the semiconductor device 22 under stress, in accordance with an example embodiment.

In one embodiment, the semiconductor device 22 to be subjected to stress is a MOSFET, and the semiconductor device 22 and the reference MOSFET 21 have separate connections to external circuits.

In some embodiments, the semiconductor device 22 to be subjected to stress and the reference MOSFET 21 share the source electrode. For example, the source contact K11' of the semiconductor device 22 to be subjected to stress is electronically coupled to the source contact K11 of the reference MOSFET 22.

In some embodiments, during testing, a voltage Vg applied to the gate 13 of the reference MOSFET 21 can be the same as a voltage Vd applied to the drain 12 of the reference MOSFET 21, thus the drain current measurement of the reference MOSFET can be performed under a Vg=Vd condition.

In some embodiments, the width of the reference MOSFET 21 is smaller than the width of the semiconductor 22 to be subjected to stress. In some embodiments, apparatus 100 is disposed on a singulation scribe line of the substrate (not shown in the Figures). Thus, the semiconductor device 22 may be tested as long as the reference MOSFET 21 is not fully removed. This arrangement of the application can reduce the area consumption of the product area of the substrate 20.

Figure 5A:
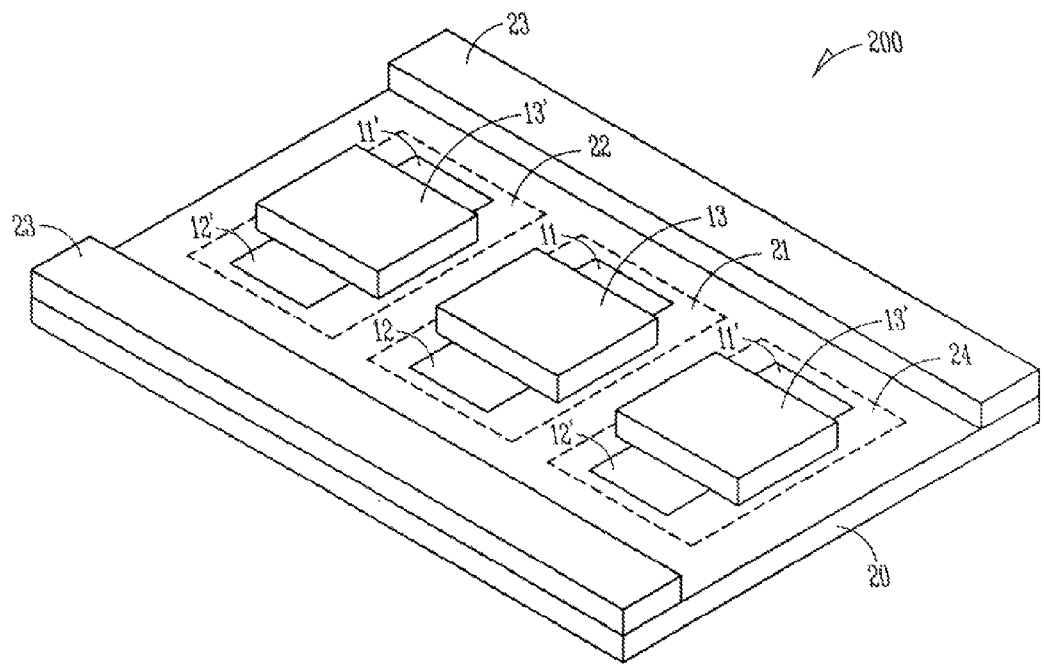
FIG. 5A is a perspective view of an apparatus for measuring temperature of a pair of semiconductor devices under stress, in accordance with another example embodiment of the application.

FIG. 5A is a perspective view of an apparatus 200 for measuring temperature of a pair of semiconductor devices 22 and 24 under stress, in accordance with another example embodiment of the application. The pair of semiconductor devices 22 and 24 to be stressed may be the same device, or may be a device broken into two parts, such as a single transistor.

In one embodiment, the apparatus 200 for measuring temperature includes: a substrate 20, and reference MOSFET 21 operated at regular use voltage. In one embodiment, devices used in reliability investigations are fresh and unstressed, as opposed to the devices to be stressed. In a further embodiment, reference MOSFET 21 may be prestressed, but such pre-stressing does not adversely affect drain current temperature dependence in one embodiment. The reference MOSFET 21 remains unstressed during stress testing in one embodiment, which is usually accomplished by not increasing the bias voltage above use voltage. If reference MOSFET 21 were to be stressed during stress testing, like the devices 22 or 24, the current through reference MOSFET 21 may change due to such stress and this change is similar to the temperature effect on the current. Thus a wrong temperature may be determined after some stress time. The measured temperature may be used to control the heater. A wrong measurement leads to temperature changes and the entire apparatus drifts uncontrolled either self enhancing or inhibiting the stress. In some embodiments, the gate bias voltage of the reference MOSFET 21 is kept low during temperature sensing to keep reference MOSFET 21 from being in a stressed condition.

The reference MOSFET 21 is supported by the substrate 20, such as disposed above the substrate, between and closely adjacent to the pair of semiconductor devices 22 and 24 intended to be stressed. The reference MOSFET 21 is disposed adjacent enough to the pair of semiconductor devices 22 and 24 such that the local surface temperature of the reference MOSFET 21 is substantially the same as the local surface temperature of the pair of semiconductor devices 22 and 24 to be subjected to stress. Thus, the local surface temperature of the pair of semiconductor devices 22 and 24 under stress can be measured using the unstressed reference MOSFET 21. In one embodiment, the stress is thermal stress. In another embodiment, the stress is thermally enhanced electrical stress. A substantially linear relation between the linear drain current (Id1) and the temperature is shown in FIG. 9 and can be utilized for calculating the local surface temperature of the reference MOSFET 21.

Figure 5B:
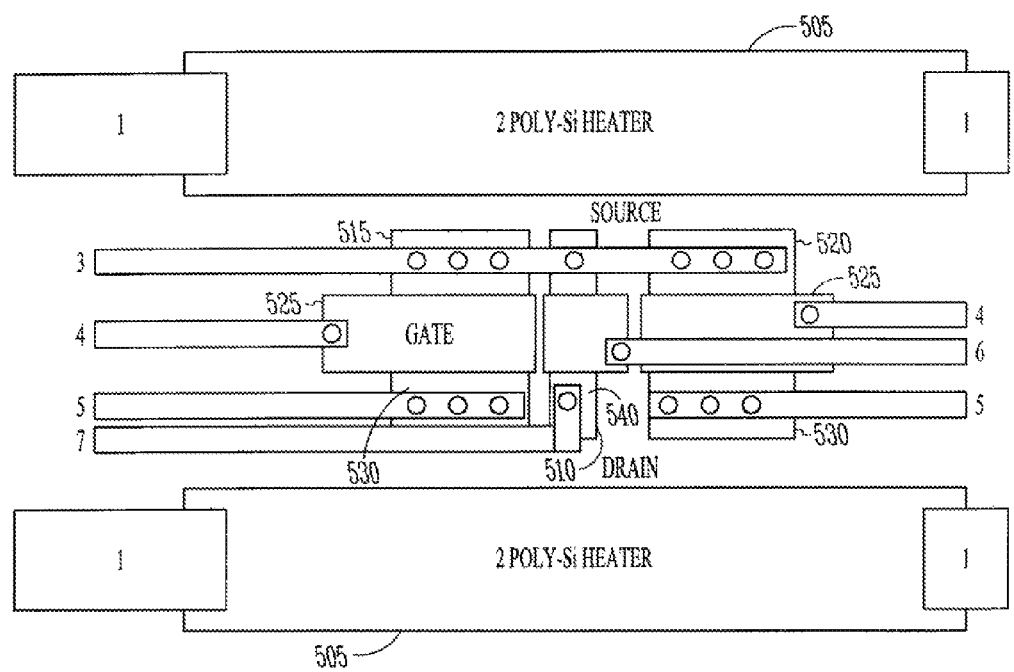
FIG. 5B is a planar top view of an apparatus for measuring temperature of a split apart semiconductor device under stress according to an example embodiment.

FIG. 5B is a planar top view of an apparatus for measuring temperature of a split apart semiconductor device under stress according to an example embodiment. A pair of heaters are indicated at 505. A reference device 510 is disposed between a split apart device to be stressed, indicated at 515 and 520, and remains unstressed. Device 515 and 520 to be subjected to stress, has a split gate 525, each coupled to a shared pad, and a split drain 530, each coupled to a shared pad via conductors with contacts to the layers of the device illustrated as circles. A source 535 may be shared between the devices and may also share a pad. A drain 540 of reference transistor 510 is coupled to a separate pad, as is a gate 545 of reference transistor 510, allowing transistor 510 to be operated in an unstressed mode and have a drain current measurement performed to determine temperature in accordance with the graph of FIG. 9. Pads are usually much larger than the devices and consume large areas of substrates. Sharing pads may reduce the area consumed. In one embodiment, the source pad may be shared with the device intended for stress. In another embodiment, a common gate and drain pad (for the sense condition Vg=Vd) may be used instead of two separate pads. As with FIG. 5A, the reference transistor 510 measures a temperature that is approximately the same as that of each of the parts of the stressed device 515 and 520.

Figure 6A:
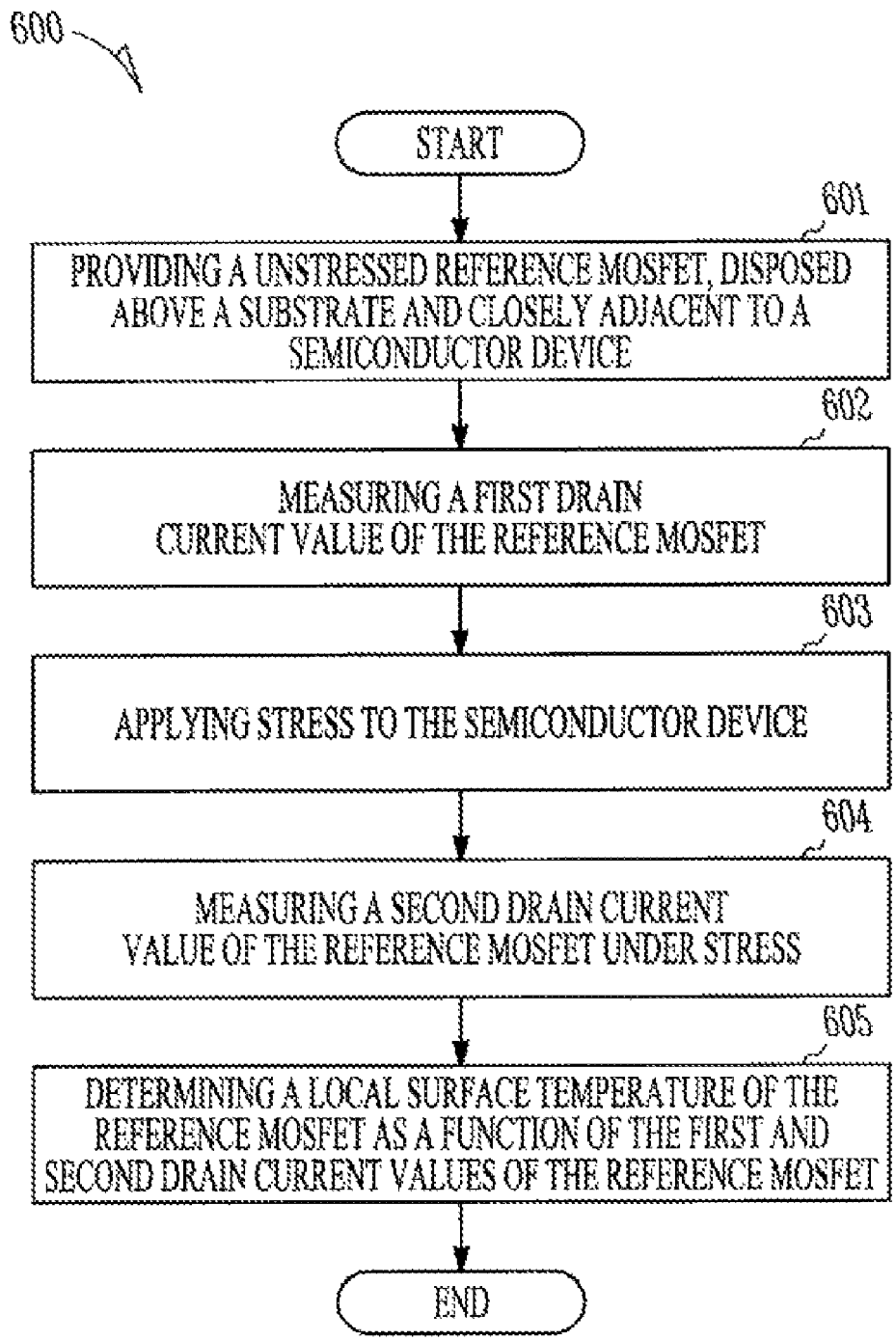
FIG. 6A is a flowchart illustrating a method of measuring temperature of a semiconductor device under stress, in accordance with an example embodiment.

FIG. 6A is a flowchart illustrating a method 600 of measuring temperature of a semiconductor device 22 under stress as shown in FIG. 1, in accordance with an example embodiment.

At 601, an unstressed reference MOSFET 21 is provided. In some embodiments, the reference MOSFET 21 is disposed above a substrate 20 and closely adjacent to a semiconductor device 22.

At 602, a first drain current value $I_1$ of the reference MOSFET is measured to provide an initial reading.

At 603, a stress, such as a thermally enhanced electrical stress, is applied to the semiconductor device 22.

At 604, a second drain current value $I_2$ of the reference MOSFET 21 under stress is measured.

At 605, a local surface temperature of the reference MOSFET 21 is determined as a function of the first drain current value $I_1$ and second drain current value $I_2$ of the reference MOSFET.

Figure 6B:
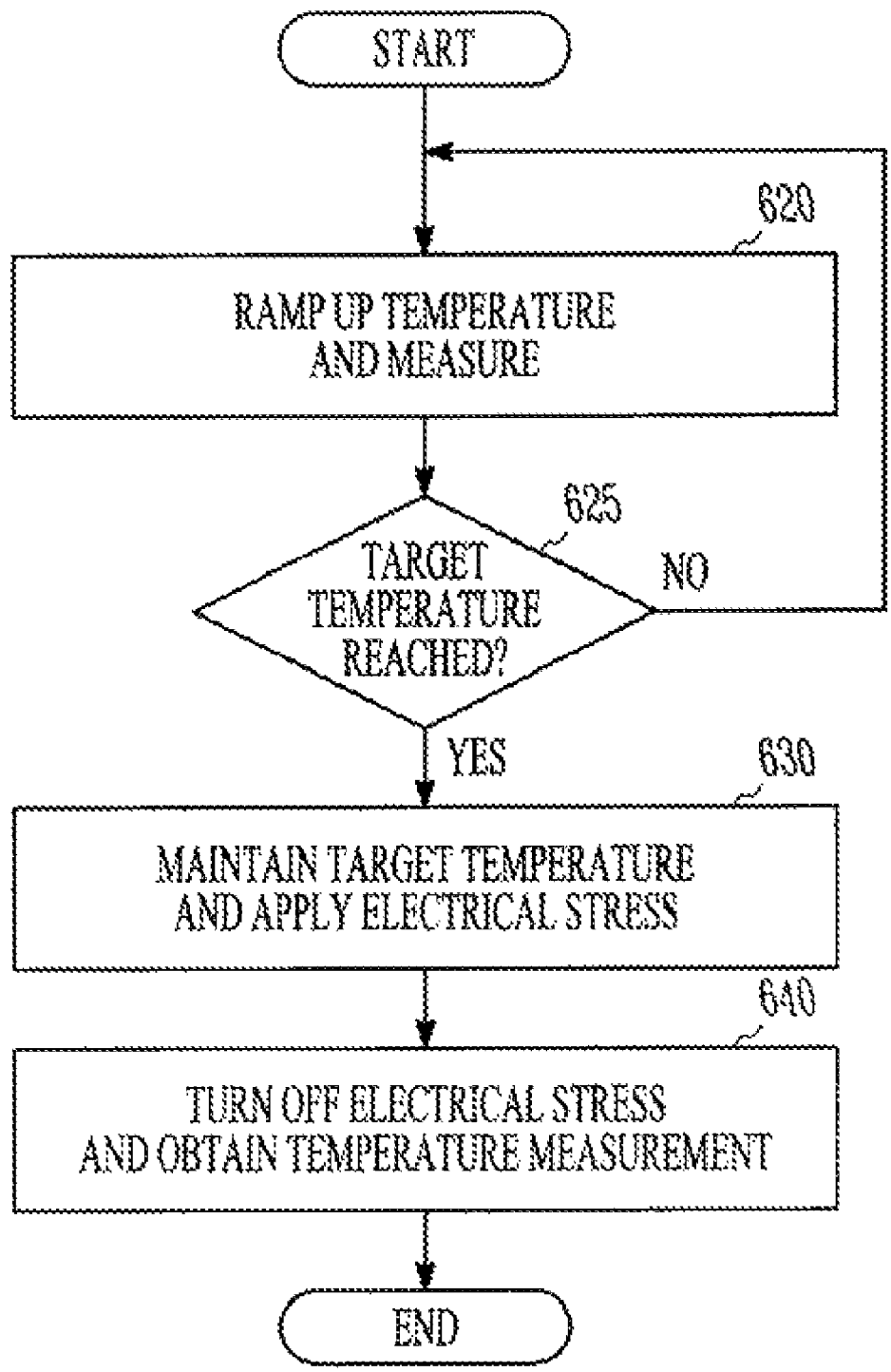
FIG. 6B is a flowchart illustrating a method of applying stress to a semiconductor device in accordance with an example embodiment.

FIG. 6B is a flowchart of one method of applying thermally enhanced electrical stress. In one embodiment the temperature is ramped up at 620 by controlling the heater 23 by repeated temperature measurements and evaluating those measurements at 625 to increase heater power to achieve a desired target temperature. Once the target temperature is reached, the reference device is used to keep the temperature constant or the reference device is no longer used and the temperature is simply kept constant by keeping the supplied power constant (this is not quite as exact as continuing measurements with the reference device). In one embodiment, once the temperature is stable, the electrical stress is started at 630. After a time defined for the stress the electrical stress may be switched off and a reference temperature reading may be performed at 640 if the temperature was kept constant by constant power. There are other cases where the heater is turned off before the electrical stress is taken off (in such cases a final reference temperature measurement is not performed for the constant-power mode).

Figure 7:
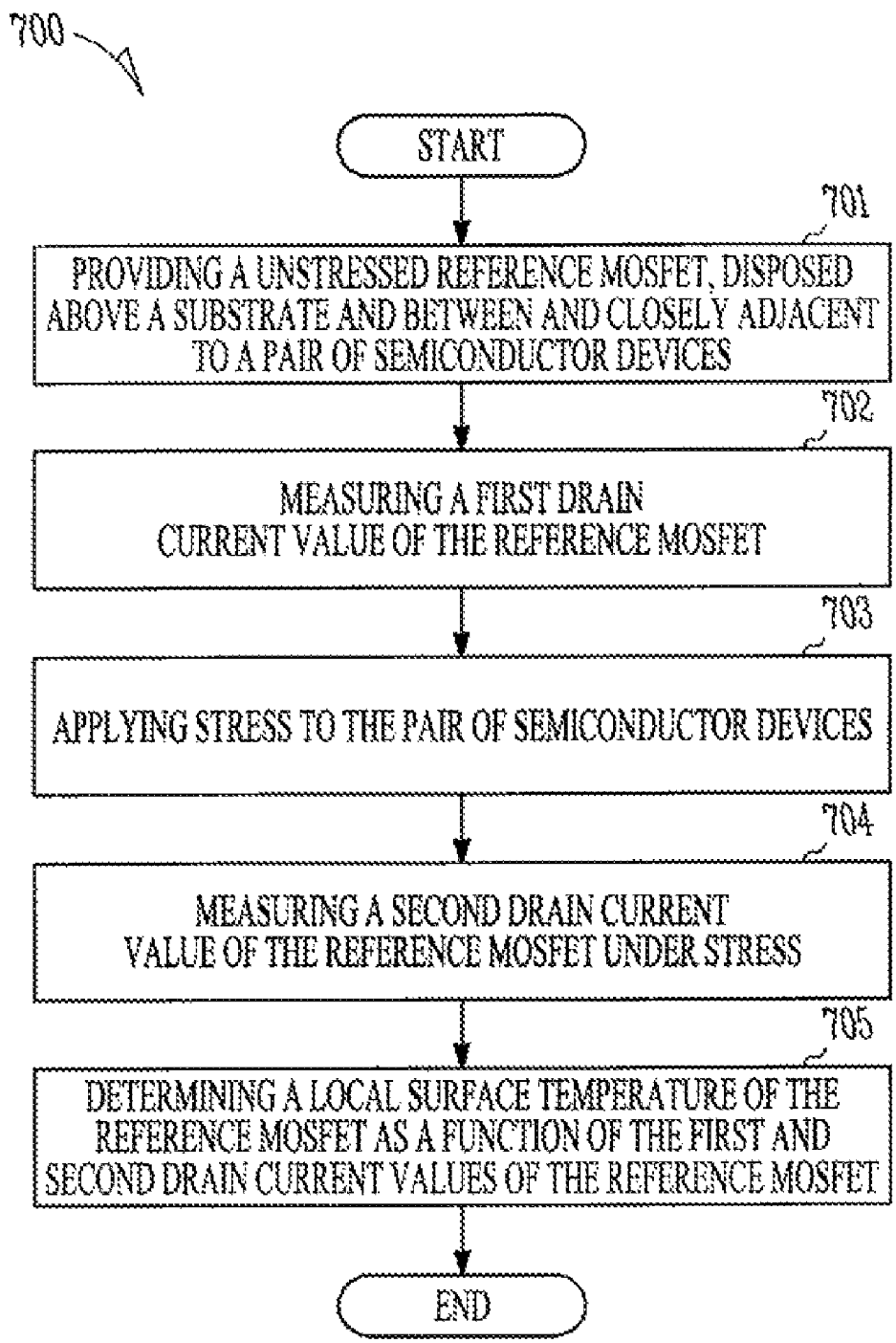
FIG. 7 is a flowchart illustrating a method of measuring temperature of a pair of semiconductor devices under stress, in accordance with another example embodiment.

FIG. 7 is a flowchart illustrating a method 700 of measuring temperature of a pair of semiconductor devices 22 and 24 under stress as shown in FIG. 5, in accordance with another example embodiment.

At 701, an unstressed reference MOSFET 21 is provided. In some embodiments, the reference MOSFET 21 is disposed above a substrate 20 and between and closely adjacent to a pair of semiconductor devices 22 and 24.

At 702, a first drain current value $I_1$ of the reference MOSFET 21 is measured.

At 703, a stress to the pair of semiconductor devices 22 and 24 is applied.

At 704, a second drain current value $I_2$ of the reference MOSFET 21 is measured during stress.

At 705, a local surface temperature of the reference MOSFET 21 is determined as a function of the first drain current value $I_1$ and second drain current value $I_2$ of the reference MOSFET.

Stress may also be applied, and temperatures measured in the same manner as illustrated in FIG. 6B.

Figure 8:
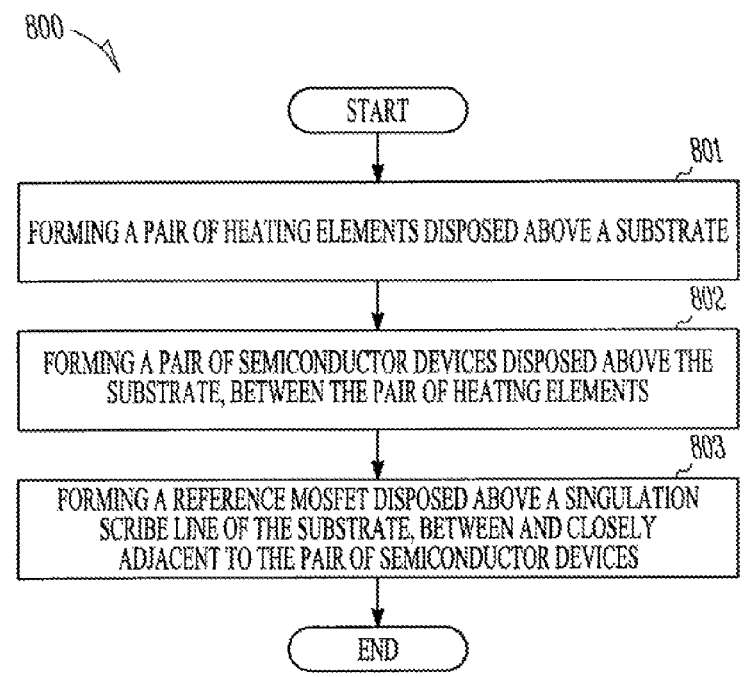
FIG. 8 is a flowchart illustrating a method of manufacturing an apparatus for measuring temperature of a pair of semiconductor devices under stress, in accordance with an example embodiment of the application.

FIG. 8 is a flowchart illustrating a method 800 of manufacturing an apparatus for measuring temperature of a pair of semiconductor devices under stress shown in FIG. 5, in accordance with an example embodiment of the application.

At 801, a pair of heating elements 23 are disposed above a substrate 20. In one embodiment, they are formed simultaneously with gate electrodes of the devices 22 and 24.

At 802, a pair of semiconductor devices 22 and 24 are disposed above the substrate 20, and between the pair of heating elements 22 and 24.

At 803, a reference MOSFET 21, as well as devices 22 and 24 are disposed in a singulation scribe line (not shown in FIG. 5) of the substrate 20. The MOSFET 21 may be formed between and closely adjacent to the pair of semiconductor devices 22 and 24. The entire structure may be either in the scribe line or a test portion of a chip.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

The invention claimed is:

1. A device comprising:
   a substrate;
   a transistor split into two portions and supported by the substrate; and
   a reference transistor supported by the substrate between and adjacent to the two portions of the split transistor wherein a drain current of the reference transistor is representative of the temperature of the transistor when under stress while the reference transistor is not under stress.

2. The device of claim 1, further comprising a first heater and a second heater, the transistor and the reference transistor disposed between the first and second heaters.

3. The device of claim 1, further comprising at least one heater supported by the substrate.

4. The device of claim 3, wherein the at least one heater is two heaters.

5. The device of claim 1, wherein a gate of one of the two portions and a gate of another of the two portions share a common pad.

6. The device of claim 1, wherein a drain of one of the two portions and a drain of another of the two portions share a common pad.

7. The device of claim 1, wherein the transistor split into two portions and the reference transistor share a common source.

* * * * *